United States Patent
Rodilla Sala

(10) Patent No.: US 6,429,642 B1
(45) Date of Patent: Aug. 6, 2002

(54) PROGRAMMABLE MONITORING DEVICE FOR ELECTRIC CONSUMPTION

(76) Inventor: Vicente Rodilla Sala, Avda. Sierra Calderona, 46-Urbanización Los Monasterios, Puzol (ES), 46530

( * ) Notice: Subject to any disclaimer, the term of this patent is extended or adjusted under 35 U.S.C. 154(b) by 0 days.

(21) Appl. No.: 09/423,440
(22) PCT Filed: May 8, 1998
(86) PCT No.: PCT/ES98/00131
§ 371 (c)(1), (2), (4) Date: Jan. 5, 2000
(87) PCT Pub. No.: WO98/50797
PCT Pub. Date: Nov. 12, 1998

(30) Foreign Application Priority Data

May 8, 1997 (ES) .............................................. 9700990

(51) Int. Cl.[7] .............................................. G01R 11/32
(52) U.S. Cl. .................................. 324/142; 324/103 R
(58) Field of Search .................................. 324/157, 142, 324/114, 115, 116, 149, 156, 103 R; 705/412

(56) References Cited

U.S. PATENT DOCUMENTS

| | | |
|---|---|---|
| 3,862,430 A | 1/1975 | Lenhart et al. |
| 3,998,093 A | 12/1976 | Bertolasi |
| 4,253,151 A | 2/1981 | Bouve |
| 4,261,037 A | 4/1981 | Hicks |
| 4,315,248 A | 2/1982 | Ward |
| 4,370,723 A | 1/1983 | Huffman et al. |
| 4,399,510 A | 8/1983 | Hicks |
| 4,620,150 A | 10/1986 | Germer et al. |
| 4,694,192 A | 9/1987 | Payne et al. |
| 4,888,495 A | 12/1989 | Feron et al. |
| 4,924,404 A | * 5/1990 | Reinke, Jr. ................... 705/412 |
| 5,315,236 A | 5/1994 | Lee |
| 5,589,764 A | * 12/1996 | Lee ............................. 324/157 |

FOREIGN PATENT DOCUMENTS

| | | |
|---|---|---|
| GB | 2 095 879 | 10/1982 |
| GB | 2 133 594 | 7/1984 |
| WO | WO 82/03482 | 10/1982 |
| WO | WO 86/05887 | 10/1986 |

* cited by examiner

Primary Examiner—Michael J. Sherry
Assistant Examiner—Minh N. Tang
(74) Attorney, Agent, or Firm—Klauber & Jackson

(57) ABSTRACT

A monitoring device which can monitor automatically and in real time the electric consumption in a house, in premises or any other building while controlling the total consumption of the complete electric installation in a predetermined area, the system including equipment for measuring (1) and indicating (5) the instantaneous consumption, and selection (4) and storage for various consumption levels. All of these operations are governed by control and processing equipment (3). There are also provided indicators for the consumed power (1) and equipment for entering (4) and displaying (5) data so that the user can control the accumulated consumption, set a limit value of the energy cost forecast and send a warning signal when such limit has been exceeded, and additionally prevent any devices from remaining connected when leaving the premises, this being extremely dangerous. The system takes measurements at different points in the installation and makes automatic connections/disconnections of certain loads in order to avoid overcurrents in the electrical network.

15 Claims, 2 Drawing Sheets

PROGRAMMABLE MONITORING DEVICE FOR ELECTRIC CONSUMPTION

OBJECT OF THE INVENTION

The invention in question refers to a programmable monitoring device for electric consumption the purpose of which is to allow automatic monitoring in real time of the electric consumption in a home, on premises and the like, such as offices, banks, stores, hotels, clinics and other public or private premises.

The total consumption of the electric installation or of the consumption of a specific area can be controlled by means of the invention.

Obviously, the invention is applicable for the control and automatic monitoring in real time of the electric consumption of any electric installation.

BACKGROUND OF THE INVENTION

The effort that is being made to obtain lower electric energy consumption in homes or premises is known. For this purpose, low consumption household appliances and low consumption light bulbs, etc. have been developed.

Now then, it is certain that this all leads to lower consumption, in homes there are no apparatus that carry out the automatic monitoring in real time of the electric consumption of a home, so that the user can take steps against high consumption, in order to furthermore avoid unpleasant surprises when the electric bill arrives.

In this sense, nowadays there is only a meter located outside the user's home, and where the electric company makes a reading of the consumption made.

These meters are located in places which are not easily and readily accessible to the user, and therefore, controlling consumption turns out to be complicated on occasions.

Furthermore, in the event that the users makes a follow-up of consumption by means of the meter, at no time does he know which is the instantaneous consumption produced in his home, and nor can he detect whether the household appliances, or any other electric apparatus, consumes energy in accordance with the manufacturer's specifications.

Besides, nor is there any device that indicates to the user, by means of consumption, if he has forgotten to turn off any light, or has left on an electric apparatus, a circumstance that helps save energy, since on occasions the user goes out inadvertently leaving on a light, or electric apparatus.

It should also be pointed out, that there is no apparatus that indicates to the user the amount of money that has been spent during a certain period of time, so that a high electric energy expenditure can be avoided.

DESCRIPTION OF THE INVENTION

In order to solve the above mentioned inconveniences, the invention has developed a programmable monitoring device for electric energy that has means for measuring and indicating the instantaneous consumption for which purpose it is provided with an alphanumeric screen on which the consumption at each moment is shown, in such a way that the user knows in real time the consumption that is produced in his home or premises.

The precise indication of instantaneous electric consumption by means of the alphanumeric screen, makes it possible to monitor and decide, if applicable, to disconnect the unnecessary electric appliance or lighting, which otherwise would remain inadvertently turned on and would be consuming energy, even for a very long time, if the dwellers were to leave the home unknowingly, which causes an evident risk.

The disconnection of the unnecessary household appliance or lighting can be done manually by the user or automatically by means of relays.

The fact that the user can know the instantaneous consumption is useful in order to be able to control the correct operation of any household appliance or electric apparatus, for which purpose it suffices to make a comparative measurement of the nominal consumption indicated by the manufacturer of the household appliance or apparatus in question, with the consumption that increases upon turning on the apparatus.

Besides the monitoring device of the apparatus is provided with means of selection and storage of different consumption levels and means for indicating the different consumption levels, to indicate to the user within what limits the instantaneous consumption produced in his home or premises is in.

The signals sent to the means for indicating the different consumption levels, may be used to control the state of the relays that carry out the above described automatic disconnection.

The means for indicating the different consumption levels are comprised of different colored optical indicators, one for each established level, in such a way that they can be checked rapidly and simply at a distance. For example, three different indicative levels can be programmed: low consumption, average consumption and excess consumption of a value somewhat lower than that of prescribed disconnection that the safety system of the installation would cause upon exceeding the contracted power.

Besides the invention has at least one acoustic indicator, that indicates, by means of different sounds or phrases by a recorded voice, each one of the power levels and other data or alarms of interest for the user. Hence, the acoustic monitoring device warns when the limit established by the user as normal consumption, as well as when the instantaneous consumption approaches the maximum power contracted for a home or premises, has been approached. This latter warning takes place, just as it has been commented above, before the prescribed disconnection that the safety system of the installation would cause, avoiding the subsequent complications and the risks, derived from a short circuit, at night or during the day. Besides, it avoids overheating of the prescribed safety devices of the electric installation itself.

Another characteristic of the invention consists of it having a meter or indicator of the consumed power, as well as means for introducing and displaying the cost of the kilowatt-hour, and means for establishing and displaying the cost of consumption accumulated during a specific period of time.

It also has means for introducing a limit value of the energy cost forecast up to a specific date and means for indicating when this limit has been exceeded.

The means for introducing the cost of the kilowatt-hour and the means for establishing the cost of the consumption accumulated during a specific period of time, are defined by a keyboard, while the corresponding display means are defined by the above mentioned alphanumeric screen.

Therefore, by these means the user can request instantaneous information of the cost accumulated during a specific period of time, and introduce a limit value of the energy cost forecast up to a specific date. In this way, the invention warns the user in the event that this limit has been exceeded before the desired time, the user being able to determine at that moment, the most appropriate measures, well before the corresponding electric bill is received.

Likewise, the means for indicating when the limit of the energy cost forecast up to a certain date has been exceeded, can be defined by optical and/or acoustic indicators.

The means for storing the different energy level values, as well as the means for storing the kilowatt-hour cost, are defined by a memory, whose operation is controlled by a microprocessor that carries out the processing of the different data and control of the operation of each and every one of the elements that comprise the programmable monitoring device of the invention.

It should be mentioned that the described monitoring device permits its use as an energy control peripheral in a domotic installation, since it can communicate the different instantaneous readings and the values preselected by the users to a personal computer, or the like, so that they automatically manage the pertinent connection or disconnection of loads in the home or premises.

Besides, the invention allows one to measure at one or several points of the installation, for which purpose a meter that is connected to a transmitter/receiver to send the data to the microprocessor of the monitoring device of the invention is installed at the points, so that said microprocessor may also be connected to a transmitter/receiver.

Besides, the system has a transmitter/receiver that is connected to a second microprocessor for the purpose of allowing automatic reprogramming of the microprocessor of the invention, so that all the functions available in the successive models of the equipment can be automatically updated.

All the described means, have the big advantage that they prevent the risks of fire, explosion or other disasters, derived from eventual electric accidents caused y household appliances or by lighting systems that remain inadvertently left on, when one leaves the home or premises.

The invention also has the advantage of permitting one to control his own private economy and energy savings in general, contributing to control the electric energy cost in populations where it is used.

Hereinafter to provide a better understanding of this specification and forming an integral part of the same, a series of figures in which the object of the invention has been represented in an illustrative and non-restrictive manner is accompanied.

DESCRIPTION OF AN EMBODIMENT OF THE INVENTION

Figure 1:
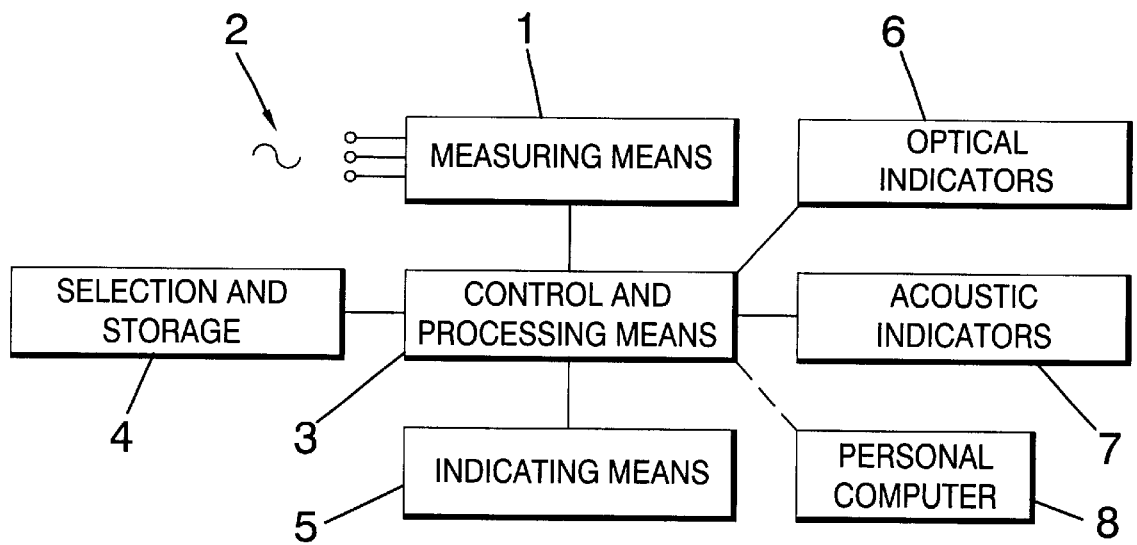
FIG. 1 shows a functional block diagram of a possible embodiment of the programmable monitoring device of the invention.
Figure 2:
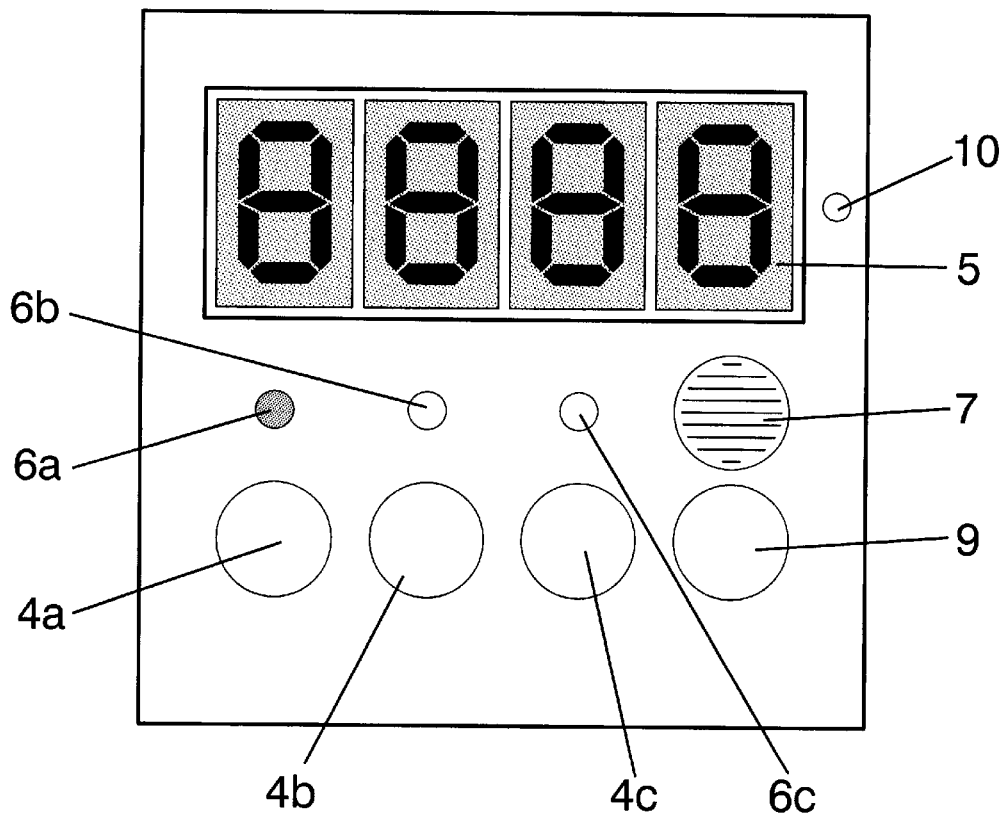
FIG. 2 shows a possible embodiment of the outside appearance of a programmable monitoring device in accordance with the invention.
Figure 3:
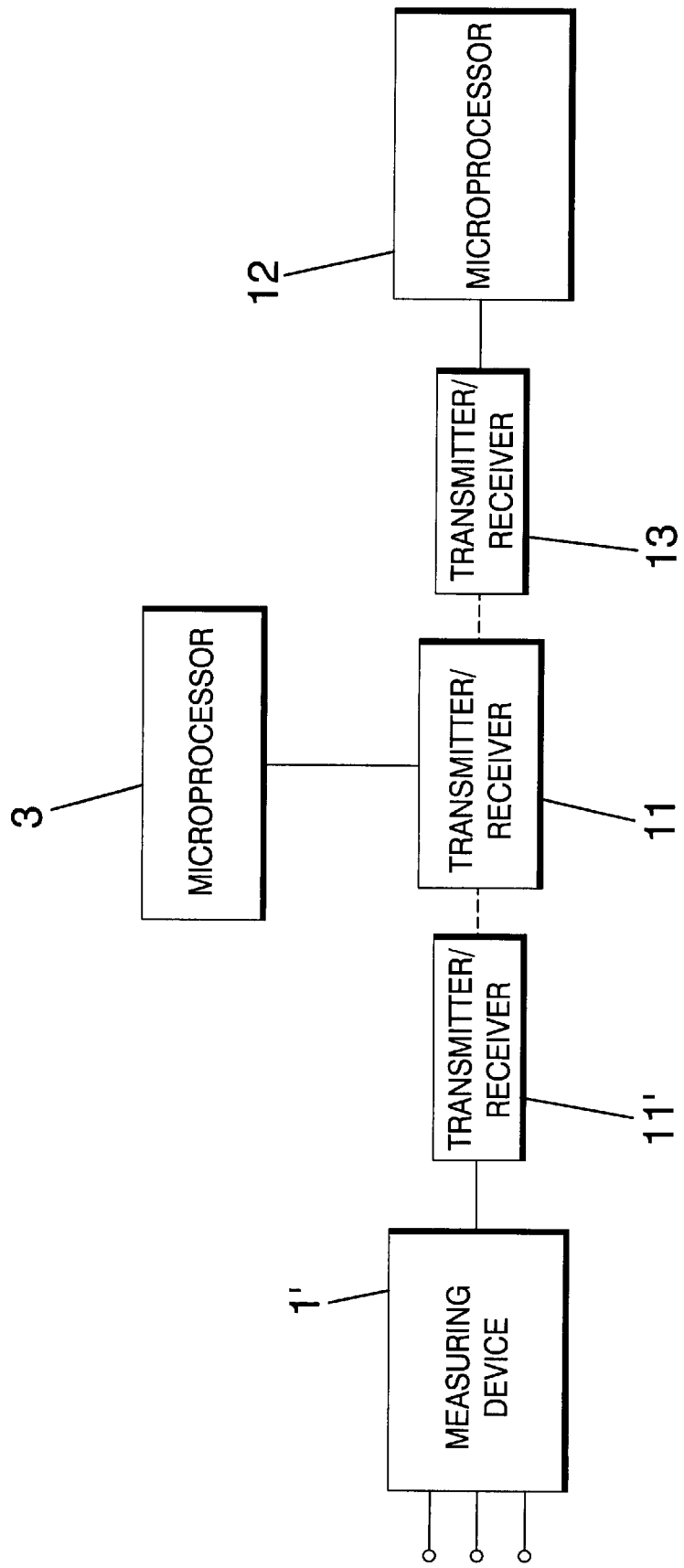
FIG. 3 shows a schematic functional block diagram for controlling and measuring different points of the user's electric installation, as well as the possibility of updating the different functions of the monitoring device of the invention.

Hereinafter, a description of the invention is made based on the above cited figures.

The monitoring device of the invention is provided with measuring equipment (1), which in the simplest embodiment, is provided with an ammeter to measure the instantaneous consumption, and in the most advanced embodiment it also includes a wattmeter to measure the consumed power.

The measuring equipment (1) is connected to the electric network (2), and this equipment includes the corresponding feed source which after filtering and stabilizing the current is connected to the different elements of the monitoring device to permit its correct operation. Besides, protection against outside anomalies is carried out by means of small batteries, which guarantee the operation thereof in cases of short circuits.

The measuring equipment (1) is connected to a digital system (3), that may be defined by a microprocessor with its corresponding storage memory, wherein different values are stored, as it will be described hereinafter.

The microprocessor (3) is connected to an alphanumeric screen (5) through which the different measurement values, as well as the programmed values, are displayed.

On the other hand, the microprocessor (3) is connected to some optical indicators (6) and to some acoustic indicators (7).

The optical indicators (6) are comprised of individual light signals, or else by multiple progressive ones and the acoustic indicators are defined by a loudspeaker.

The microprocessor (3) is capable of being connected to a personal computer (8), to permit use of the system as a peripheral of a domotic system, just as it will be described hereinafter.

The measuring equipment instantly and permanently carries out the measurement of alternating current, and admits all types of existing network voltages and frequencies.

Therefore, based on the description made it is easily understood that by means of the measuring equipment the instantaneous value of the electric consumption can be displayed on the alphanumeric screen (5), in such a way that the user, for example, when going out of his home can determine if the consumption that is being produced in the home is the appropriate one, being able to determine if some electric apparatus, light, etc. has been inadvertently left on.

By means of the keyboard (4), it is possible to program three warning levels regarding the electric consumption of the installation: a "minimum" one suitable when one goes out of his home or premises, and that would also be acceptable at night, another "nominal" one, as a limit higher than the normal electric consumption, and finally a "maximum" one, which warns about overloads. This latter value is selectable within some standard powers that correspond to the kilowatts contracted with the electric company.

In an embodiment, the keyboard (4) has simply been replaced by push buttons, in such a way that the operation of the push button (4a) allows introduction of the value of the screen as a "minimum" level reference value, while push button (4b) allows introduction of the screen value as a reference value corresponding to the "nominal" value.

On its part, push button (4c) permits by means of its operation the corresponding "maximum" value to be determined, applying to the value contracted with the electric company a safety coefficient lower than 1.

The different data are stored in the memory integrated in the microprocessor (3).

The different energy levels, can be displayed by means of the alphanumeric screen (5), or by means of optical indicators (6a), (6b) and (6c), each one of which corresponds to each one of the three selected levels. Hence, when the optical indicator (6a) is on, it indicates that the consumption is within the "minimum" value, activation of indicator (6b) indicates that the consumption is within the "nominal" value and activation of optical indicator (6c) indicates that consumption is close to the "maximum" value. In this way, the user can check, at a distance, and by a simple glance, at which level the consumption of his home or premise is.

Obviously, the number of levels can be varied in terms of the needs of the electric installation and/or the user's needs.

Just as it was already commented on above, the measuring equipment (1) also has a wattmeter that permits a record to be kept on the energy consumed in kilowatt-hours, by means of the microprocessor (3). Hence, by means of the keyboard (4) one can program the updated cost of kilowatt-hours, and request instantaneous information on the accumulated cost during a specific period, as well as introduce a limit value of the electric energy cost forecast up to a specific date. Likewise, all this information is stored in the memory provided for in the microprocessor.

In this way the monitoring device indicates to the user in the event that this limit is exceeded before the desired time, the user being able to decide, at that moment, the most appropriate measures, well before the corresponding electric bill is received.

Likewise, this indication can be made by means of the screen or by means of the acoustic indicator (7), under which a push button (9) that deactivates the possible alarms that arise, has been provided for.

It is easily understood that the microprocessor (3) can be connected to a personal computer (8), in such a way that the monitoring device acts as a energy control peripheral in a domotic installation, for which purpose the microprocessor (3) sends the different instantaneous readings and values preselected by the user to the personal computer (8), so that said computer automatically manages the pertinent load connection and disconnection operations in a home or premises, in such a way that the user can adjust consumption at will. These operations are carried out by the corresponding relays.

In the model in which push buttons are exclusively included, the function selector, may be included in the push button (4c), which aside from adapting the power limit contracted with the electric company, memorizing its corresponding "maximum" value, also permits the selection of the desired function by the user as data input, screen displays, program checks, etc.

Reference number (10) indicates a push button for lighting up the alphanumeric screen (5).

Installation of the monitoring device is very simple and exclusively consists of connecting its terminals, duly marked, with the cables of the general electric input of the home, coming from the electric energy meter. The most advanced model of the monitoring device allows the amperage to be measured by means of intensity transformers, coupled to the cabling of the premises without the need to be cut or connected to terminals. It is also possible to connect the monitoring device anywhere in the house, in order to control a specific area of the electric installation.

Based on the description made, it is easily understood that by means of the invention it is possible to carry out the measurement of consumption in one or several points of the installation, for which purpose at said point there is a measuring device (1') which is connected to a transmitter/receiver (11') that sends the result of the measurement made to a transmitter/receiver (11) connected to the microprocessor (3). This transmission may be done by radio frequency, infrared, or any other known way.

Besides, in order to obtain the maximum functionality and ergonomics in the programming of the monitoring device, a microprocessor (12) connected to a transmitter/receiver (13) both in a portable unit that makes it possible to automatically update all the functions available in successive models of the initial base equipment, without the need to physically replace the different apparatus that are in use, has also been provided for. In the embodiment the transmitter/receiver (11) receives signals both from the transmitter/receiver (11') as well as from the transmitter/receiver (13), but obviously there could also be independent transmitters/receivers for each one of the transmitters/receivers (11') and (13).

What is claimed is:

1. A programmable monitoring device for electric consumption comprising:
   measuring means and first indicating means for measuring and indicating an instantaneous consumption value;
   selecting means and storing means for selecting and storing a plurality of consumption levels;
   second indicating means for indicating a plurality of consumption levels, to indicate to a user within which limits an instantaneous consumption is comprised;
   control and processing means;
   at least one push button;
   wherein
      when said at least one push button is actuated, the control and processing means activates
      the measuring means to measure an instantaneous consumption value;
      the selecting means to select the instantaneous consumption value; and
      the storing means to store the instantaneous consumption value as a reference value for a consumption level corresponding to the actuated push button.

2. A programmable monitoring device for electric consumption, according to claim 1, further comprising:
   a measuring and indicating device of consumed power;
   means for introducing and means for displaying kilowatt-hour cost;
   means for establishing and means for displaying cost of consumption accumulated during a specific period of time.

3. A programmable monitoring device for electric consumption, according to claim 2, further comprising means for introducing a limit value of an energy cost forecast up to a specific date, and means for indicating when such a limit is exceeded.

4. A programmable monitoring device for electric consumption, according to claim 1, wherein the second indicating means are optical indicators of different colors, one for each established consumption level.

5. A programmable monitoring device for electric consumption, according to either of claims 1 and 4, wherein consumption levels are selected from:
   a minimum consumption level;
   a nominal consumption level as top limit of normal consumption;
   a maximum consumption level of a value lower than a prescribed value for disconnection by a safety system of an electric installation.

6. A programmable monitoring device for electric consumption, according to claim 1, wherein the second indicating means is an acoustic indicator that generates different sounds and/or phrases by a recorded voice for each power consumption level.

7. A programmable monitoring device for electric consumption, according to claim 6, wherein the acoustic indicator of each consumption level, indicates when the instantaneous consumption value is close to a maximum contracted consumption level.

8. A programmable monitoring device for electric consumption, according to claim 2, wherein the means for introducing the kilowatt-hour cost is a keyboard.

9. A programmable monitoring device for electric consumption, according to claim 1, further comprising three push buttons, including
- a first push button corresponding to a minimum consumption level;
- a second push button corresponding to an intermediate consumption level;
- a third push button corresponding to a maximum consumption level.

10. A programmable monitoring device for electric consumption, according to any of claims 1 to 3, further comprising an alphanumeric screen to display data selected from instantaneous consumption; consumption levels; kilowatt-hour cost; consumption accumulated during a specific period of time; and
- a limit value of an energy cost forecast up to a specific date.

11. A programmable monitoring device for electric consumption, according to claim 1, wherein the storing means includes a memory.

12. A programmable monitoring device for electric consumption, according to claim 1, wherein the control and processing means is a first microprocessor.

13. A programmable monitoring device for electric consumption, according to claim 1, further comprising
- means for direct connection and disconnection of external loads inherent to an electric installation;
- means for communicating with a domotic installation that carries out connection-disconnection operations of loads of a home or premises.

14. A programmable monitoring device for electric consumption, according to claim 1, further comprising at least one measuring means installed in at least one location of an electric installation, each said measuring means connected to a first transmitter/receiver to send data from said location to a second transmitter/receiver connected to the control and processing means.

15. A programmable monitoring device for electric consumption, according to claim 12, further comprising a second outside portable microprocessor connected to a third transmitter/receiver to automatically update all new functions that become available without need to change an apparatus initially acquired by a user for which purpose it communicates with a second transmitter/receiver connected to the first microprocessor.

* * * * *